United States Patent [19]

Collin

[11] Patent Number: 4,853,652
[45] Date of Patent: Aug. 1, 1989

[54] WIDE BAND AND LOW NOISE AMPLIFIER FOR METRIC WAVES

[75] Inventor: Robert Collin, Cholet, France
[73] Assignee: Thomson-CSF, Paris, France
[21] Appl. No.: 169,461
[22] Filed: Mar. 17, 1988
[30] Foreign Application Priority Data
  Mar. 20, 1987 [FR] France .................. 87 03923
[51] Int. Cl.⁴ .......................................... H03F 1/34
[52] U.S. Cl. ..................................... 330/294; 330/149
[58] Field of Search ............... 330/294, 303, 154, 144, 330/149

[56] References Cited

FOREIGN PATENT DOCUMENTS 0184483 6/1986 European Pat. Off. .
1263401 4/1960 France .
1295540 4/1961 France .
 849316 9/1960 United Kingdom .

Primary Examiner—Gene Wan
Attorney, Agent, or Firm—Oblon, Spivak, McClelland, Maier & Neustadt

[57] ABSTRACT

A wide band low noise amplifier for metric waves, including a transistor connected by its emitter to the ground of the amplifier through two secondary windings, connected in series, of a first and second transformer, and coupled between its base and its emitter by the primary winding of the first transformer, one end of the primary winding of the second transformer being connected to the collector of the transistor, the output signal of the amplifier being taken from all or part of the primary of the second transformer and the number of turns of the secondaries of the transformers being very low so as to limit the leak inductance, which amplifier further comprises a first resistor connected in series with the two secondary windings and a second resistor connected between the output of the amplifier and the transistor base.

5 Claims, 1 Drawing Sheet

4,853,652

WIDE BAND AND LOW NOISE AMPLIFIER FOR METRIC WAVES

BACKGROUND OF THE INVENTION

The present invention relates to a wide band and low noise amplifier for metric waves. It applies particularly to the construction of receivers operating close to transmitting antennae.

Conventionally this type of amplifier includes a transistor connected as common emitter, associated with a feed-back transformer between the output and the input of the amplifier, i.e. between the collector of the transistor and its base. Such a circuit makes it possible to obtain a high-frequency voltage at the terminals of the transformer, but the parasite capacitances of the feedback windings limit the pass band.

A solution to this problem was described by the applicant in the French patent application No. 84 172 95. The amplifier which is there described comprises a transistor associated with a feed-back circuit, including two transformers. The primary of the first transformer is connected between the emitter of the transistor and its base, and the primary of the second transformer is connected between the collector of the transistor and the common potential point. The secondaries of both transformers are connected in series with the emitter circuit of the transistor. The output signal of the amplifier is taken from a part of the primary of the secondary transformer and the number of turns of both secondaries is very low so as to limit the leak inductance.

Thus a reverse gain of the amplifier is obtained practically identical to and of a sign opposite its forward gain. But because of the coupling of the source and load circuits, problems occur in matching the source and load circuits which are difficult to overcome especially when these circuits are formed by filters, the mismatching of the circuits causing modifications of the response curves.

SUMMARY OF THE INVENTION

The aim of the invention is to overcome the above drawbacks.

For this, the invention provides a wide band low noise amplifier for metric waves, including a transistor connected by its emitter to the ground of the amplifier through two secondary windings, connected in series, of a first and second transformer, and coupled between its base and its emitter by the primary winding of the first transformer, one end of the primary winding of the second transformer being connected to the collector of the transistor, the output signal of the amplifier being taken from all or part of the primary of the second transformer and the number of turns of the secondaries of the transformers being very low so as to limit the leak inductance, which amplifier further comprises a first resistor connector in series with the two secondary windings and a second resistor connected between the output of the amplifier and the transistor base.

BRIEF DESCRIPTION OF THE DRAWINGS

Other features and advantages of the invention will be clear from the following description with reference to the accompanying drawings which show.

DETAILED DESCRIPTION OF THE INVENTION

Figure 1:
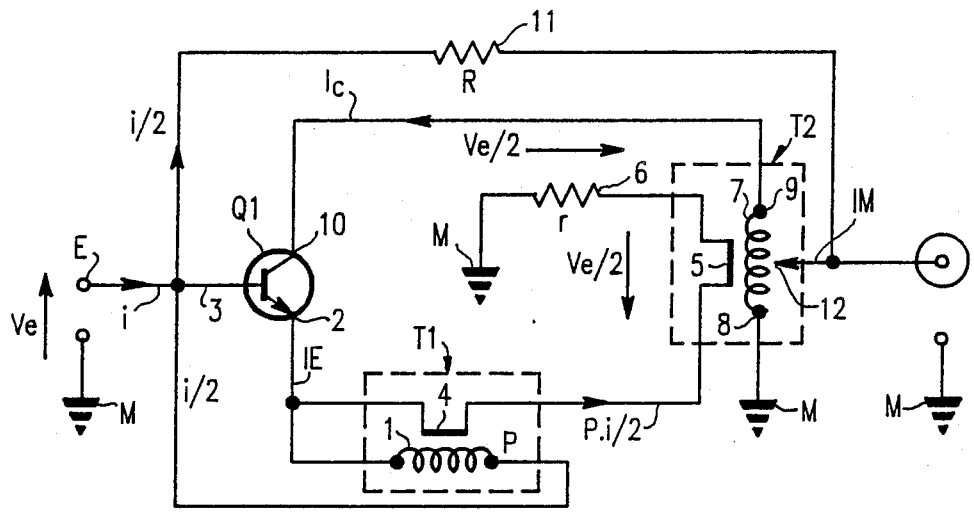
FIG. 1 a general electric diagram of one embodiment of the amplifier of the invention.

The amplifier which is shown in FIG. 1, organized about a ground circuit M serving as potential reference, includes a transistor Q1 coupled to a feed-back circuit formed by two transformers D1 and D2 shown inside broken lines. The primary winding 1 of transistor T1 is disposed between the emitter 2 and the base 3 of transistor Q1. The emitter 2 is connected to the ground circuit M through a secondary winding 4 of transformer T1, a secondary winding 5 of transformer T2 and a resistor 6 of value r, the assembly of these three elements being connected in this order in series between the emitter 2 and the ground circuit M. Transformer T2 has a primary winding 7 whose ends 8 and 9 are connected respectively to the ground circuit M possibly through a DC supply source of the ramplifier, not shown, and to the collector 10 of transistors Q1. A feed-back resistor 11 of value R connects an intermediate tapping 12 of the primary of transformer T1 to the base 3 of transistor Q1. The voltage VE to be amplified is applied between the base 3 and the ground circuit M. The Output voltage VS is taken between the intermediate tapping 12 and the ground circuit M.

So as not to introduce too high a leak inductance in the emitter circuit of transistor Q1, the two secondary windings 4 and 5 are each formed by a winding comprising a single turn. The primary winding 1 of transformer T1 comprises p turns and the primary winding of transformer T2 comprises N turns. The primary winding 7 of transformer T2 comprises, between its end 8 and the intermediate point 12, M turns at the terminals of which the output voltage VS of the amplifier is taken.

The operation of the amplifier is described hereafter on the assumption that the transistor Q1 is an ideal transistor, ie. that its input impedance Ze is infinite in the circuit considered and that its base-emitter voltage is zero. Under these conditions, the voltage at the terminals of the secondary winding 4 is zero and the voltage VE is divided in the emitter circuit between the terminals of the secondary winding 5 and the resistor 6 of value R. In the example shown in FIG. 1, the value r is determined so that the voltage VE is divided equally between the terminals of resistor 6 and in the secondary winding 5. The output voltage VS is equal to $-M(VE/2)$ which given a voltage gain G of the amplifier of $-M/2$. Similarly, the value R of resistor 11 is determined so that the current i generated at the input to the amplifier by the voltage E is also divided into two currents of intensity $i/2$ in both branches of the circuit formed by resistor 11 and the primary winding 1. The current flowing through the turn of the secondary winding 4 is then equal to $p.i/2$ and it is also equal to the current which flows through the secondary winding 5.

The emitter current flowing through the transistor si then under these conditions equal to $$I_e = p \cdot i/2 - i/2 \text{ i.e. } I_E = (p-1) \cdot i/2 \tag{1}$$

Since we assumed the current $I_b$ flowing in the base of transistor Q1 is zero, the collector current Ic is equal to the emitter current $I_E$, so we have:

$$I_c = (p-1) \cdot i/2 \tag{2}$$

Writing that the number of ampere turns produced by the currents in the first and second transormers T2 are opposite, we obtain the relationship:

$$p \cdot i/2 \cdot 1 = -|(p-1) \cdot i/2 \cdot N - M \cdot i_M| \quad (3)$$

where $i_M$ designates the current entering through the intermediate tapping 12.

If we again assume that the input and output impedances Zo of the amplifier are identical, we obtain:

$$V_s/i_s = V_e/i = Z_O \quad (3)$$

where $i_s$ designates the output current of the amplifier.

Since $V_s = (-M/2) \cdot V_e$ the relationship is verified if $i_s$ is equal to $(M/2) \cdot i$, whence it follows that $i_M = (M/2) \cdot i + i/2 = (M+1) \cdot i/2$. Substituting the value of $i_M$ in the equation (3) we obtain:

$$N = (M \cdot (M+1) -) P/(p-1 \quad (5)$$

Since the value of M fixes the voltage gain of the amplifier, the relationship (5) shows that for each fixed gain value there exists a high number of solutions for N.

For example, by choosing a voltage gain M/2=4, a certain number of solutions are possible for the choice of the number of turns P and N of the primaries of transformers T1 and T2:
with M=8, expression (5) becomes N=(72−p)/(p−1) and the following solutions are possible:
if p=2, N=70
if p=3, N=34.5
if p=4, N=22.6
if p=5, N=16.7
if p=6, N=13.4
if p=7, N=10.8
if p=8, N=9.1
if p=9, N=7.8

By taking for example the solution M=8, p=9, and N rounded to 8 (M=N) and for $Z_O$ the value of 50 ohms, we obtain $$R = V_e + (M/2) \cdot V_e)/(i/2) = 2 \cdot Z_O(G+1) = 500 \text{ ohms}$$

and $$r = (V_e/2)/(p \cdot (i/2)) = 5.5 \text{ ohms}$$

In practice, a higher value will be taken for R so as to compensate for the current in the transistor based and a lower value for r so as to take into account the input impedance of $r_e$.

Figure 2:
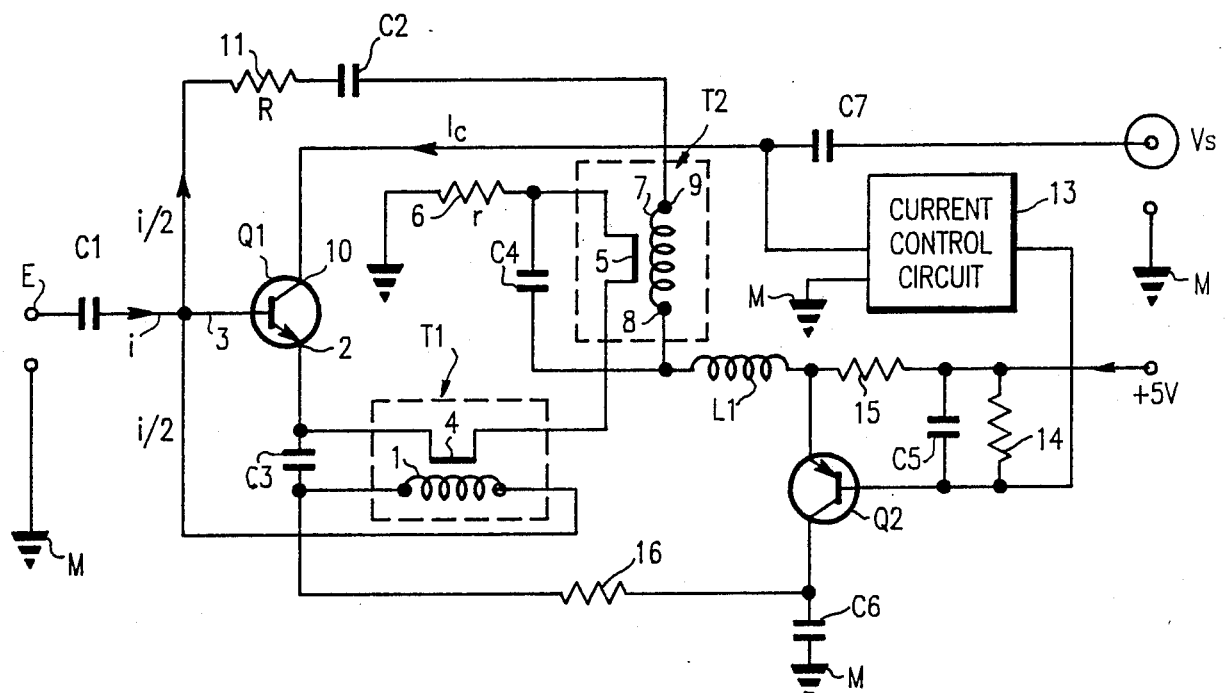
FIG. 2, an adaptation of the diagram of FIG. 1 to the construction of a metric wave or VHF reception amplifier having a wide band and low noise.

The adaptation of the amplifier which has just been described to the construction of a wide band low noise metric wave reception amplifier is shown in FIG. 2 where the elements similar to those of the amplifier shown in FIG. 1 are designated by the same reference numbers. In comparison with the circuit of FIG. 1, the amplifier of FIG. 2 has in addition means for adapting the consumption of the amplifier to the interfering signals received for example from a transmitting antenna situated nearby, so as to obtain at all times the best possible noise factor. Still referring to FIG. 1, the amplifier further comprises connecting capacitors, C1, C2, and C3. The capacitor C1 connects the input E of the amplifier to the transistor base Q1, capacitor C2 connects the end 9 of the primary winding 7 to the end of resistor 11 which is not connected to the transistor base Q1, and the capacitor C3 connects the emitter of transistor Q1 to the end of the primary winding 1 which is not connected to the transistor base Q1. The means for adapting the consumption of the amplifier to the interfering signals are formed by a transistor Q2 controlled at its base by a current control circuit 13 whose input is connected to the collector of transistor Q1. The transistor base Q2 is connected both to the output of the current control circuit 13 and to the transistor Q2 emitter through two resistors 14 and 15 connected in series. In the embodiment shown, the common point to resistors 14 and 15 is biased to a supply potential of +5 V. A capacitor C5 decouples the resistor 14. The end 8 of the primary winding 7 is connected both to the transistor Q2 emitter through a shock inductance L1 and to the common point between resistor 6 and the secondary winding 5 through a decoupling capacitor C4. The collector Of transistors Q2 is connected to the end common to the decoupling capacitor C3 and to the primary winding 1 through a resistor 16 for acting on the base current of transistor Q1. The collector of transistor Q2 is further decoupled from the ground circuit by a capacitor C6.

In a particular embodiment of the invention, a circuit such as the one shown in FIG. 2, has given the following results, for a band of exploded frequencies between 30 and 90 MHz. The measurements were made for two current consumptions, one at 7 milliamps and the other at 26 milliamps. In both cases, forward gains of 10.7 dB and 11.6 dB and reverse gains from 26 dB to 33 dB were obtained depending on the frequency. For a current consumption I=7 milliamps, the complex input impedance $Z_e$ was measured between 56 ohms $\times$ Exp·j·5° and 62 ohms $\times$ Exp·j·3°, and the output impedance $Z_s$ was measured between 58 ohms $\times$ Exp·j·6° and 60 ohms $\times$ Exp·j·4°, the noise factor F being equal to 2.3 dB. For a current consumption I=26 milliamps, the input impedance $Z_e$ was measured between 50 ohms $\times$ Exp·j 7° and 60 ohms $\times$ Exp·j 11° and the output impedance $Z_s$ as measured was between 51 ohms $\times$ Exp·j 7° and 57 ohms $\times$ Exp·j 2°, the noise factor being equal to 2.5 dB. Furthermore, with the high current of 26 milliamps, the compression point at 1 dB was obtained for an input voltage of 280 millivolts.

It goes without saying that the invention is not limited to the embodiments described above. Other variants are of course possible depending particularly on the frequency, pass band and signal to noise ratio performances which it is desired to obtain and a man skilled in the art will readily agree that the circuits of FIGS. 1 and 2 could very well be modified depending on the needs, without departing from the scope of the invention.

What is claimed is:

1. A wide band low noise amplifier for metric waves, comprising a transistor connected by its emitter to the ground of the amplifier through two secondary windings, connected in series, of a first and second transformer, and coupled between its base and its emitter by the primary winding of the first transformer, one end of the primary winding of the second transformer being connected to the collector of the transistor, the output signal of the amplifier being taken from all or part of the primary of the second transformer and the number of turns of the secondaries of the transformers being very low so as to limit the leak inductance, and further comprising a first resistor connected in series with the two secondary windings and a second resistor connected between the output of the amplifier and the transistor base.

2. Amplifier according to claim 1, wherein the secondary windings of said two transformers each comprise a single spire.

3. Amplifier according to claim 1, wherein the voltage gain of the amplifier is equal to $-M/2$, the output voltage being taken from the terminals of M turns of the primary of the second transformer, the primaries of both transformers having respectively p and N turns, p M, N being integers satisfying the expression $N \geq ((M(M+1)-p)/(p-1)$.

4. Amplifier as claimed in claim 3, wherein the number M is equal to the number N.

5. Amplifier as claimed in claim 4, further comprising a circuit for controlling the transistor current for regulating the current consumption of the amplifier as a function of the amplifier of interfering signals which may be received so as to obtain at all times the best possible noise factor.

* * * * *